(12) United States Patent
Tryhub et al.

(10) Patent No.: US 9,184,776 B2
(45) Date of Patent: Nov. 10, 2015

(54) SIGNAL TUNING WITH VARIABLE INTERMEDIATE FREQUENCY FOR IMAGE REJECTION AND METHODS

(76) Inventors: John Tryhub, Mississauga (CA); Lance Greggain, Woodbridge (CA); Gary Cheng, Markham (CA); Stephen Jantzi, Laguna Beach, CA (US)

( * ) Notice: Subject to any disclaimer, the term of this patent is extended or adjusted under 35 U.S.C. 154(b) by 654 days.

(21) Appl. No.: 13/004,755

(22) Filed: Jan. 11, 2011

(65) Prior Publication Data

US 2011/0171919 A1 Jul. 14, 2011

Related U.S. Application Data

(60) Provisional application No. 61/294,092, filed on Jan. 11, 2010.

(51) Int. Cl.
*H04B 1/28* (2006.01)
*H04B 1/10* (2006.01)
*H03D 7/18* (2006.01)

(52) U.S. Cl.
CPC .. *H04B 1/28* (2013.01); *H03D 7/18* (2013.01); *H04B 1/1027* (2013.01)

(58) Field of Classification Search
CPC ........... H03D 7/18; H04B 1/1027; H04B 1/28
USPC .......................................................... 455/285
See application file for complete search history.

(56) References Cited

U.S. PATENT DOCUMENTS

| | | | | |
|---|---|---|---|---|
| 5,963,856 | A * | 10/1999 | Kim | 455/307 |
| 6,118,499 | A * | 9/2000 | Fang | 348/726 |
| 6,516,186 | B1 * | 2/2003 | Yamagishi et al. | 455/302 |
| 6,675,024 | B1 * | 1/2004 | Loke et al. | 455/553.1 |
| 7,031,686 | B2 * | 4/2006 | Kim et al. | 455/285 |
| 7,555,280 | B2 * | 6/2009 | Kim | 455/313 |
| 2003/0032398 | A1 * | 2/2003 | Harris | 455/147 |
| 2003/0162521 | A1 | 8/2003 | Vorenkamp et al. | |
| 2005/0225679 | A1 | 10/2005 | Okanobu et al. | |
| 2008/0225182 | A1 * | 9/2008 | Silver et al. | 348/726 |

* cited by examiner

*Primary Examiner* — David Bilodeau
(74) *Attorney, Agent, or Firm* — Trellis IP Law Group, PC

(57) ABSTRACT

In a method and apparatus for operating a super-heterodyne receiver, a tuning circuit has a local oscillator for frequency shifting a desired channel to a selected frequency and a controller for controlling the local oscillator. The controller determines for each of a number of identified channels, whether an image signal is present at frequencies in the spectrum that when tuned to a first selected frequency interfere, and is operable to select a modified selected frequency at which interference between the image signal and the identified channel is reduced.

34 Claims, 6 Drawing Sheets

SIGNAL TUNING WITH VARIABLE INTERMEDIATE FREQUENCY FOR IMAGE REJECTION AND METHODS

CROSS-REFERENCE TO RELATED APPLICATIONS

The present application claims priority under 35 U.S.C. §119(e) from the provisional U.S. patent application Ser. No. 61/294,092 filed on Jan. 11, 2010, entitled "SIGNAL TUNING WITH VARIABLE INTERMEDIATE FREQUENCY FOR IMAGE REJECTION AND METHODS" the contents of which are incorporated herein by reference.

FIELD OF THE INVENTION

The present invention relates generally to signal tuning circuits and more particularly to tuner/receivers with variable frequency tuning for image rejection.

BACKGROUND OF THE INVENTION

Tuning circuits, such as super-heterodyne tuners are commonly used in communications equipment, such as radios, televisions and the like. A super-heterodyne tuner typically includes one or more mixers, used to frequency shift (or mix) a channel to be received to an intermediate frequency. At the intermediate frequency, the channel may be decoded/demodulated into a baseband signal.

The amount that a signal is shifted by the local oscillator depends on whether its frequency is higher or lower than the frequency of the channel to be tuned. For any mixing frequency, there are potentially multiple signals that could be shifted to the same intermediate frequency and interfere: one at the mixing frequency plus the intermediate frequency, another at the mixing frequency minus the intermediate frequency; and others at the intermediate frequency, plus or minus integer multiples of the mixing frequency.

Typically, only one of these is desired to be frequency shifted to the intermediate frequency. The remaining, undesired signals that may be inadvertently frequency shifted to the intermediate frequency are commonly referred to as image signals.

Several different techniques are known to eliminate image signals, prior to mixing. For example, image signals may be filtered using a variable frequency low pass, or band pass filter. Image reject mixers and/or complex mixers that add additional signals to remove the image frequency from the output may also be used. Likewise, some combination of filtering and image reject mixer circuitry may be used to ensure adequate rejection of signals at image frequencies.

All these techniques require relatively complex filter/mixing circuits that have their own shortcomings.

Accordingly, new image rejection methods and super-heterodyne receivers employing such rejection are desirable.

SUMMARY OF THE INVENTION

According to one aspect of the invention, there is provided a tuning circuit comprising, a mixer and a local oscillator for frequency shifting a desired channel to a selected frequency; a controller for controlling said local oscillator and said selected frequency, said controller operable to determine the presence of identified channels at candidate frequencies, and for each identified channel, determine if an image signal is present at frequencies in said spectrum, that when tuned to a first selected frequency interfere; if for an identified channel, an image signal is present, select a modified selected frequency at which interference between said image signal and said identified channel is reduced, when said identified channel is tuned to said modified selected frequency.

According to another aspect of the invention, there is provided a method of operating a super-heterodyne receiver, comprising: determining the presence of identified channels at candidate frequencies; for each identified channel, determining if an image channel is present at frequencies in said spectrum, that when tuned to a first intermediate frequency interfere; for an identified channel for which an image channel is present, determining a modified intermediate frequency at which interference between said image channel and said identified channel is reduced, when tuned to said modified intermediate frequency interfere.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures which illustrate by way of example only, embodiments of the present invention.

DETAILED DESCRIPTION

Figure 1:
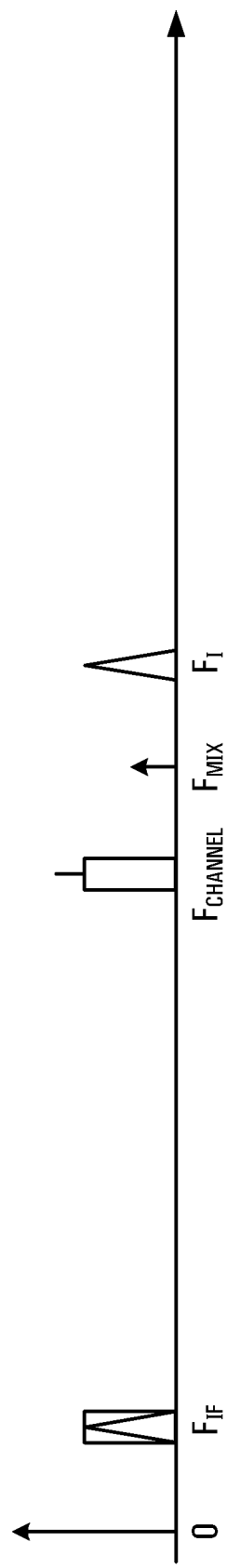
FIG. 1 is spectral graph illustrating the presence of a channel to be tuned, an image channel, and an intermediate frequency to which the channel is to be mixed.

FIG. 1 illustrates a frequency spectrum, including a channel to be mixed to an intermediate frequency for demodulation, using a super-heterodyne receiver/tuner. As illustrated, a selected intermediate frequency to which a channel of interest is to be tuned or mixed is centered at $F_{IF}$. An example channel of interest is illustrated centered at $F_{CHANNEL}$. The channel may be tuned or mixed to the selected frequency through mixing with a mixing frequency $F_{MIX}$.

For high side injection ($F_{MIX} > F_{CHANNEL}$) $F_{MIX}$, $F_{CHANNEL}$ and $F_{IF}$ are related, with $F_{MIX} - F_{CHANNEL} = F_{IF}$. Thus, by adjusting $F_{MIX}$, different selected channels may be tuned to the intermediate frequency band, centered at $F_{IF}$, for further processing, demodulation and/or decoding.

In addition to tuning a channel at $F_{MIX}+F_{CHANNEL}=F_I$ to the intermediate frequency band, a mixing signal at $F_{MIX}$ will tune signals centered at $F_{MIX}+F_{CHANNEL}=F_I$, to the intermediate frequency band centered $F_{IF}$. This is clearly acceptable if there are no signals in the spectrum at this frequency. In the presence of another channel within a band centered at $F_I$, the channel at $F_I$ will be mixed to the intermediate frequency, $F_{IF}$, and interfere with the desired channel centered at $F_{CHANNEL}$ tuned to $F_{IF}$.

Similarly, channels spaced from intermediate frequency, at frequencies that are multiples of the mixing signal (i.e. harmonics thereof) at $2*F_{MIX}\pm F_{IF}$, $3*F_{MIX}\pm F_{IF}$, $4*F_{MIX}\pm F_{IF}$, $5*F_{MIX}\pm F_{IF}$, etc. (all $n*F_{MIX}\pm F_{IF}$ for n=2, 3, 4, . . . ) will be mixed to the intermediate frequency band, centered at $F_{IF}$.

These channels may be collectively and individually be considered image channels for a given channel, at $F_{CHANNEL}$ to be tuned to $F_{IF}$.

As will be appreciated, if low-side injection mixing is used (i.e. with $F_{MIX}<F_{CHANNEL}$) potential image channels will exist at $F_{MIX}-F_{IF}$.

As noted, different techniques are known to eliminate image channels. In conventional super-heterodyne receivers image channels may be filtered using a variable frequency low pass (for high side injection), or band pass filter. Image reject mixers and/or complex mixers that add additional signals remove the image frequency from the output may also be used. Likewise, some combination of filtering and image reject mixer circuitry may be used to ensure adequate rejection, in the presence of image channels.

Figure 2:
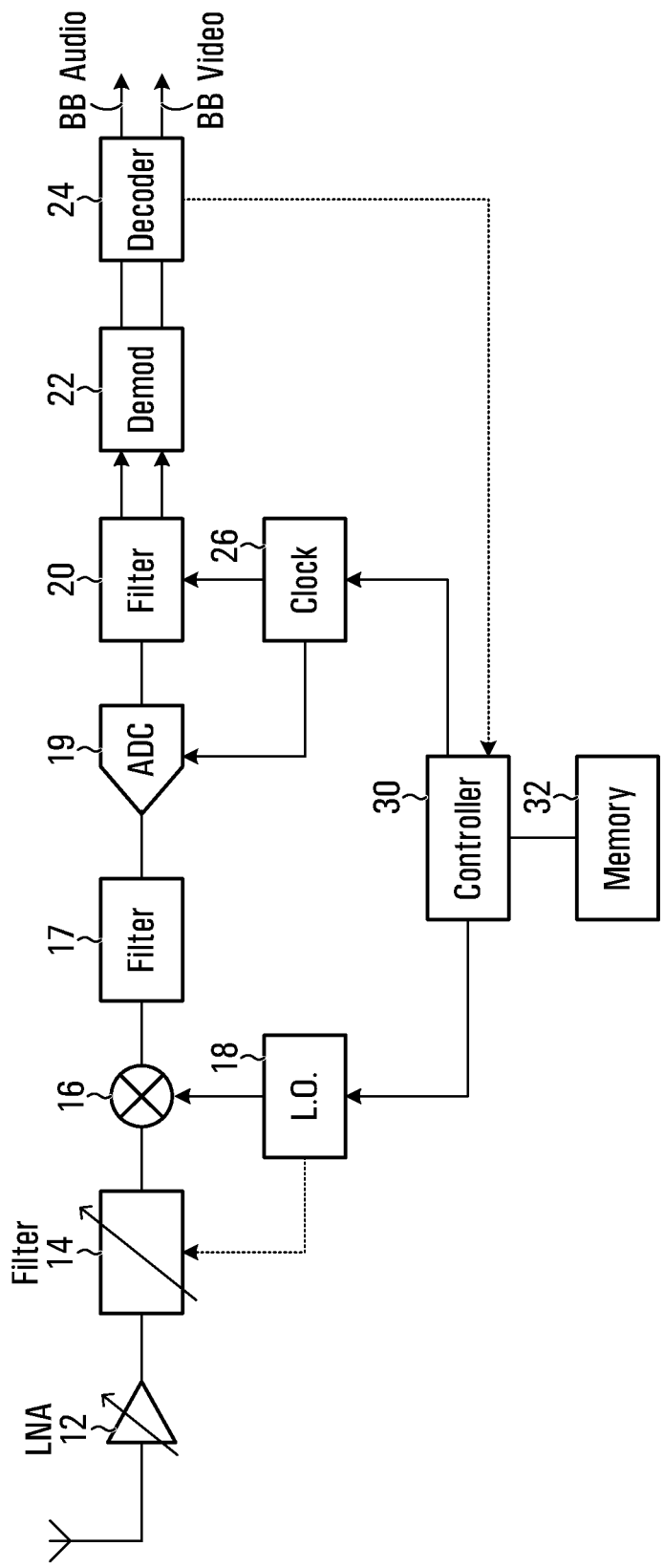
FIG. 2 is a block diagram of a super-heterodyne tuner/receiver exemplary of an embodiment of the present invention.

FIG. 2 schematically illustrates a tuner/receiver 10, exemplary of an embodiment of the present invention. As will become apparent, tuner 10 may form part of a television or radio tuner, and may be used in a television receiver, set-top box, computing device, multi-media receiver, or the like. As illustrated, tuner/receiver 10 includes a low noise amplifier (LNA), 12 providing a received analog signal to a filter 14. The output of filter 14 is provided to an analog mixer 16, driven by a local oscillator 18. The resulting mixed analog signal may be further filtered at filter 17 and converted to a digital representation by an analog to digital converter (ADC) 19, whose output may be provided to a digital filter 20. The output of filter 20 is provided to a demodulator 22 (and optional decoder) to provide one or more baseband signals.

Filter 14 may be a tracking band-pass filter, low-pass filter or notch filter that filters a signal representing one or more channels of interest, to be mixed to the intermediate frequency by mixer for demodulation and decoding. Filter 14 may be a tracking filter, whose pass band, notch or low pass frequency may be adjusted depending on the frequency of a signal to be tuned. For example, if tuner/receiver 10 is acting as a super-heterodyne NTSC television tuner, the frequency of filter 14 may be adjusted based on the band that the channel to be tuned is in—e.g. VHF-LOW/VHF-HI or UHF.

Mixer 16 may be formed in any number of ways. Mixer 16 may be a harmonic rejection mixer. Mixer 16 includes a local oscillator 18 that controls the mixing frequency of mixer 16, to allow mixer 16 to tune an arbitrary channel to an intermediate frequency.

Filter 17 may be an analog bandpass filter having a center frequency that may or may not be adjustable. The center frequency of filter 17 may be controlled by clock 26. In the depicted embodiment, the bandwidth of filter 17 is about two to four times the bandwidth of a channel to be tuned, and may be formed as an RLC filter.

A/D converter 19 may sample the received broadband signal at a sampling rate of 288 MHz—8 times the intermediate frequency—to provide a digital signal to filter 20. A/D converter 19 may be a sigma delta ($\Sigma\Delta$). Filters within a $\Sigma\Delta$ A/D typically prevent A/D conversion of signals outside a limited band about the sampling frequency. Signals outside this band are subject to quantization noise. In the depicted embodiment A/D converter 19 effectively converts signals in a band of about 10 MHz about the intermediate frequency.

Filter 20 may be a separation filter, used to separate audio and video signals in the channel tuned to the intermediate frequency. To this end, filter 20 may have a very sharp filter/separation frequency. Filter 20 may for example, be formed as the digital equivalent of two surface acoustic wave (SAW) filters used in television tuners to filter audio and video within a channel at the intermediate frequency.

Demodulator 22 may be a digital demodulator and may include its own clock to digitally resample the digital signals in the intermediate frequency band, to demodulate a tuned channel to provide video and audio signals. As required, these signals may be further decoded into video and audio.

A clock 26 controls the sampling rate of A/D converter 19. Clock signals derived in synchronism from clock 26 may control the center frequency of filter 20 and demodulator 22.

A controller 30 including memory 32 controls operation of receiver 10. Controller 30 may be a conventional processor, microcontroller, or similar application specific integrated circuit (ASIC), or portion thereof. Controller 30 may control the frequency of local oscillator 18, and may be in communication with demodulator 22, to control clock 26. Memory 32 may store code to be executed by controller 30, as well as operating parameters. Memory 32 may thus be any suitable combination of dynamic random access memory (RAM); read only memory (ROM); firmware memory; or the like.

As noted, the exemplary tuner/receiver 10 may be part of a television receiver used to tune a television channel. The receiver may be suitable for tuning an NTSC, PAL, SECAM, DVB-T, DVB-T2, ATSC, QAM, ISDB-T, or similar RF television signal. The frequency content of the channel, locations of channels and standards for image rejection are specific to each particular broadcast system. For NTSC, the channel widths are 6 MHz. DVB-T channel widths can be 6, 7, or 8 MHz. PAL and SECAM channel widths are between 6 and 8 MHz. The RF signal may be received by way of terrestrial broadcast antenna, satellite antenna, coaxial cable, or the like. A suitable decoder 24 may form part of tuner/receiver 10 to decode demodulated signals and provide decoded video and/or audio.

Exemplary of embodiments of the present invention, image rejection in the presence of an interfering image channel(s) or signal, may be provided by adjusting the mixing frequency, generated by local oscillator 18, from $F_{MIX}$ to $F'_{MIX}$ to move the selected intermediate frequency $F_{IF}$ to a new adjusted frequency $F'_{IF}$ so that the image channel no longer interferes (or interferes less) with the tuned channel $F_{CHANNEL}\cdot F_{CHANNEL}$ is mixed to $F'_{IF}$ by mixer 16 using the adjusted mixing frequency $F'_{MIX}$.

Filter 14, 17 and 20 may serve in removing the image channel(s) at $F_I$ from the modified selected intermediate frequency band at $F'_{IF}$. Filter 20, in fact, represents any combination of filters that exist after the tuner whether they are before or after any other mixer that might be used in the process of demodulating or otherwise mixing the desired channel to baseband.

Once $F'_{IF}$ has been adjusted, the operation of clock 26 may also need to be adjusted so that analog to digital converter 19, and filter 20 all operate properly at the new $F'_{IF}$. For example, the clock of A/D converter may be adjusted to sample the signal at a rate equal to eight (8) time the modified intermediate frequency. Likewise clock signals derived from clock 26, and controlling filter 20 would have their frequencies modified in synchronism, thereby adjusting the center frequencies of filter 20.

Figure 3:
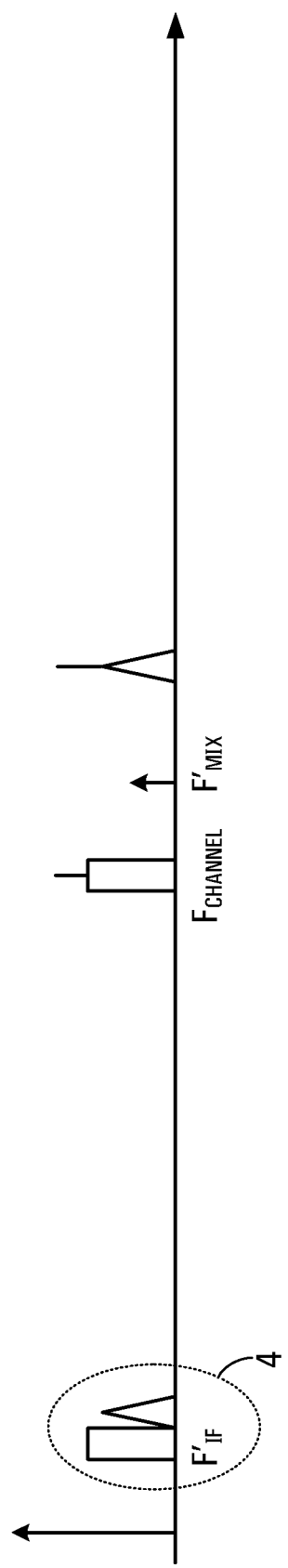
FIG. 3 is a spectral graph, illustrating the presence of a channel to be tuned, an image channel, and an intermediate frequency to which the channel is to be mixed.
Figure 4:
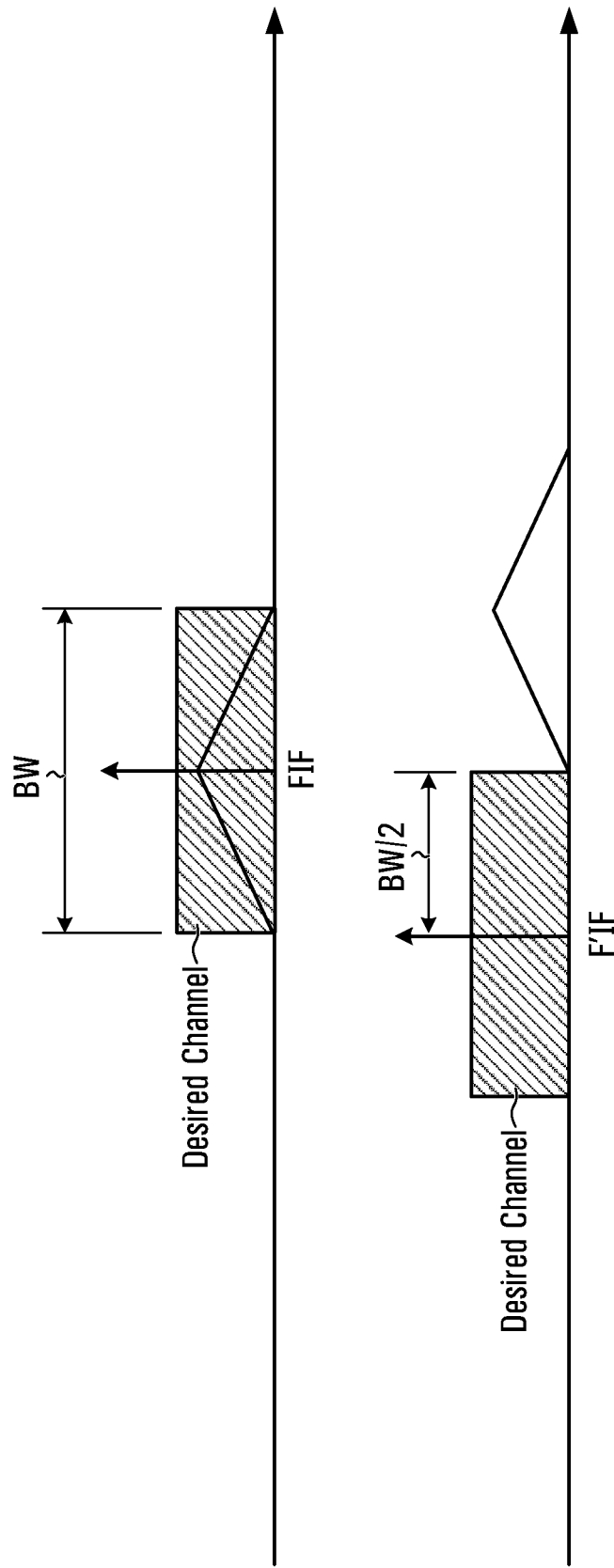
FIG. 4 is an enlarged view of a portion of FIG. 3.

Choice of a new $F'_{IF}$ may best be appreciated with reference to FIGS. 3 and 4. As illustrated in FIG. 3, adjusting $F'_{MIX}$ to $F_{MIX}+\Delta$ will mix the channel at $F_{CHANNEL}$ to $F'_{IF}=F_{IF}+\Delta$. Further, the image at channel $F_I$ will be mixed to $F_{IF}-\Delta$. As such, provided $\Delta$ is chosen to exceed the one half the bandwidth of the tuned channel and the image channel, no overlap me be achieved.

That is, if exactly zero overlap between the original image channel and the tuned channel at $F'_{IF}$ is desired, then $F'_{IF}$ may be determined as follows for high-side injection, $$F_I = F_{MIX} + F_{IF} = F_{CHANNEL} + 2*F_{IF},$$

$$F'_{IF} = F_{IF} + BW/2,$$

where BW is the bandwidth of both the desired and the original image channels.

$$F'_{MIX} = F_{CHANNEL} + F_{IF} + BW/2.$$

This is illustrated in FIG. 4.

Now, a new image channel for $F_{CHANNEL}$, when mixed to $F'_{IF}$, may be centered at $F_{MIX}+F'_{IF}=F_{CHANNEL}+2*F_{IF}+BW$, exactly one (1) channel away, higher in frequency, from the original image channel. If such a channel does not exist $F'_{IF}=F_{IF}+BW/2$ may be used.

Alternatively $F_{IF}$ may be moved in the opposite direction and have the same effect. That is, by making $F'_{IF}=F_{IF}-BW/2$ the target frequency is moved one half the channel bandwidth lower and the new image frequency is moved one (1) channel lower than the original image channel. If such a channel does not exist $F'_{IF}=F_{IF}-BW/2$ may be used.

If an image channel is present only because of harmonics of $F_{MIX}$ (e.g. at $n*F_{MIX}\pm F_{IF}$), $\Delta$ may be chosen to have a value less than BW/2.

For example, if an image channel is the image channel below the third harmonic of the modulating signal at $F_I=3*F_{MIX}-F_{IF}=3*F_{CHANNEL}+2*F_{IF}$, and would completely overlap the desired channel when modulated to $F_{IF}$:

again using $F'_{IF}=F_{IF}-BW/2$, so $F'_{MIX}=F_{CHANNEL}+F'_{IF}=F_{CHANNEL}+F_{IF}-BW/2$ and $F_{Inew}=3*F'_{MIX}-F'_{IF}=3*F_{CHANNEL}2*F'_{IF}=3*F_{CHANNEL}2*F_{IF}-BW.$ This places the new image channel exactly one (1) channel away lower in frequency from the original image channel.

Similarly, to perform the same change if the original image channel is the image channel above the third harmonic of the modulating signal (i.e. the "upper third harmonic image"), at $F_I=3*F_{MIX}+F_{IF}=3*F_{CHANNEL}+4*F_{IF}$, a completely overlapping channel requires $F'_{IF}$ to be only BW/4 away from $F_{IF}$ to eliminate the overlap.

For an image channel at the lower fifth harmonic image $(F_I=5*F_{MIX}-F_{IF}=5*F_{CHANNEL}+4*F_{IF})$ a completely overlapping channel requires $F'_{IF}$ to be BW/4 away from $F_{IF}$ to eliminate the overlap. For an image channel at the upper fifth harmonic image $(F_I=5*F_{MIX}+F_{IF}=5*F_{CHANNEL}+6*F_{IF})$ a completely overlapping channel requires $F'_{IF}$ to be BW/6 away from $F_{IF}$ to eliminate the overlap.

As should thus be appreciated, avoidance of higher harmonic image frequencies generally requires less frequency shift than do the first image and third harmonic image frequencies.

If the overlap of the image channels is not complete, less movement in $F_{IF}$ is required to remove the overlap of channels. For instance for the first image if the channel overlap is OV MHz, $F'_{IF}$ need only be moved to $F_{IF}-OV/2$ if it must be lower or $F'_{IF}$ must be $F_{IF}+OV/2$ if it must be higher to eliminate the overlap. By extension if the image is the lower fifth harmonic then F'IF must be $F_{IF}+/-OV/4$ MHz to eliminate overlap. Similar extensions for higher harmonics should be apparent.

Also if additional guard-band separation of GB MHz beyond the edge of the channels is desired, $F'_{IF}$ may be moved to Ft+/-(OV+GB)/2 MHz for the first image and lower third harmonic image and to Ft+/-(OV+GB)/4 MHz for the upper third and lower fifth harmonic images, and so on.

Conveniently then, receiver/tuner 10 (and in particular microcontroller 30) may determine if image channels corresponding to identified channels exist, and adjust the selected intermediate frequency from $F_{IF}$ to $F'_{IF}$ for those channels for which an image channel exists, at the nominal frequency $F_{IF}$. This may be done by determining for each identified received channel one or more image channels exist for a given first nominal selected frequency used as the intermediate frequency, and adjusting the selected frequency to avoid those (and other) channels that would interfere with a tuned channel, tuned to the intermediate frequency.

Memory 32 may contain program code to determine which channels in the spectrum are being received, and which of these may be image channels for a nominal intermediate frequency.

Figure 5A:
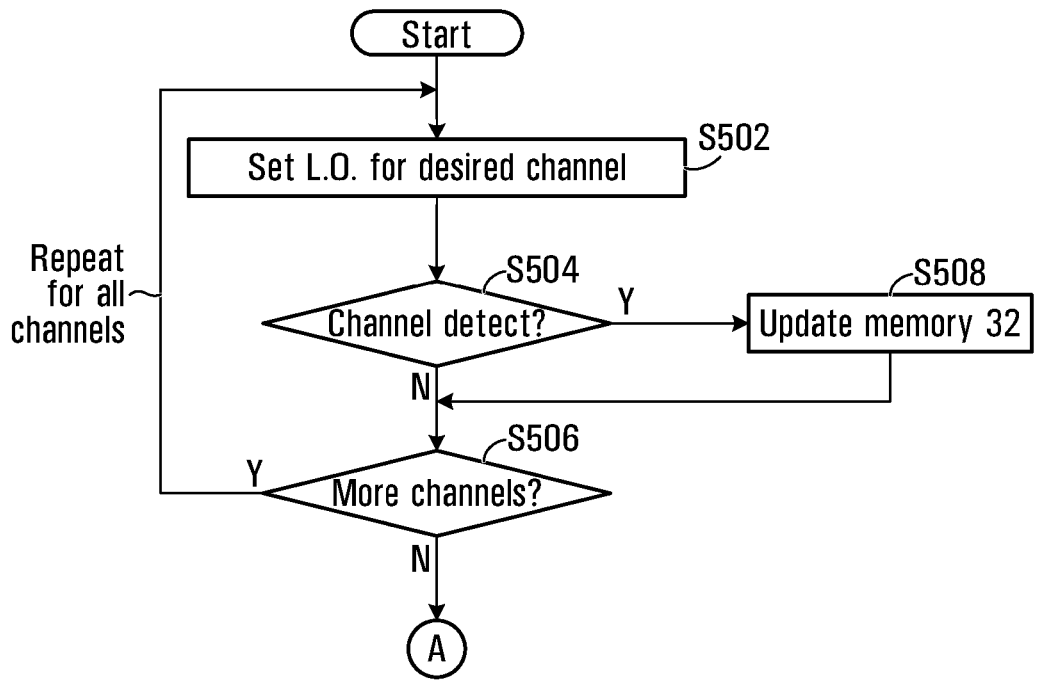
FIGS. 5A and 5B is a flow chart of a method performed at the tuner/receiver of FIG. 2, exemplary of an embodiment of the present invention.
Figure 5B:
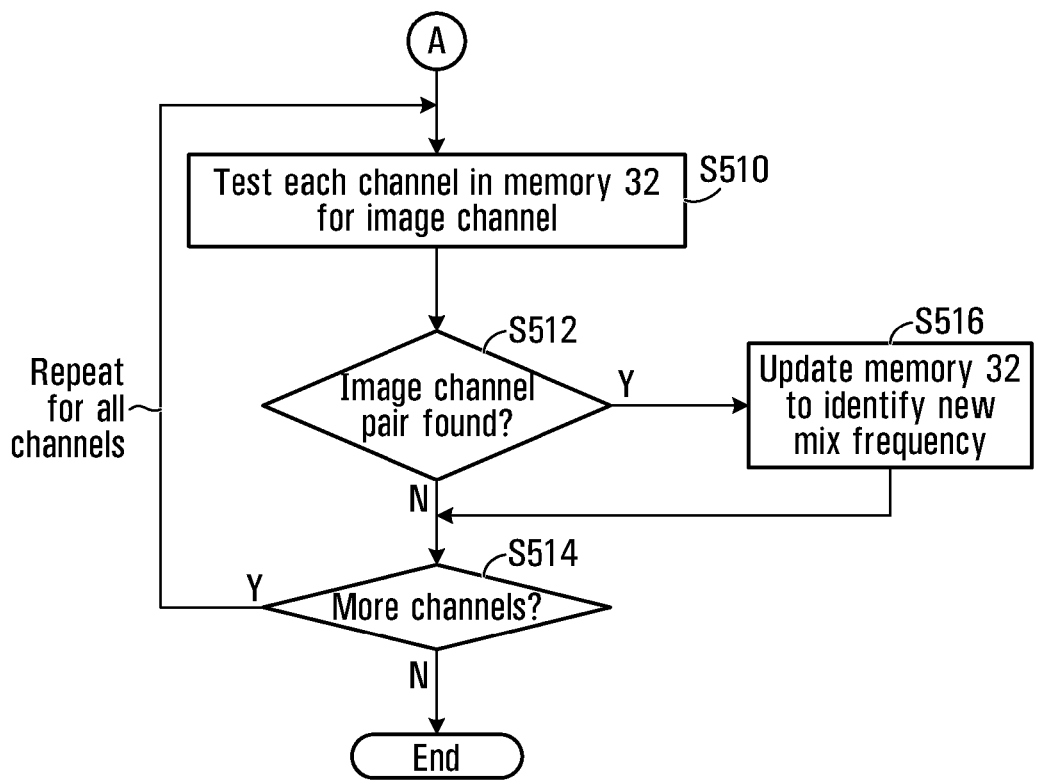

Blocks performed by controller 30 under software/firmware control are illustrated in FIG. 5.

As illustrated, receiver 10 may perform a channel scan to determine received channels in blocks S502-S506. Specifically, the frequency of local oscillator 18 may be advanced to correspond to every known channel within a broadcast band in block S502. A signal representing the channel (e.g. a carrier frequency, a digital signal in the channel, or the like) may be detected by demodulator 22/decoder 24, and its presence may be signalled to controller 30 in block S504. Blocks S502-S506 are repeated for all channels to be scanned. For example, all channels in the conventional VHF/UHF TV broadcast bands could be scanned.

Controller 30 then may note whether or not a particular channel has been detected in block S504. After a channel scan, the collection of received channels in the spectrum will have been identified and may be stored in memory 32. Specifically, for each possible channel, one or more bits indicating whether a signal has been detected for a channel at a particular center frequency may be stored.

Once the received channels are known, software or firmware within memory 32 may further determine any channel for which another received channel is an image channel in blocks S510-S514. To that end, once all received channels have been identified, controller 30 may simply examine memory 32 to assess whether for each received channel at frequency $F_{CHANNEL}$, another channel at $F_{MIX}+F_{CHANNEL}$ $(F_{IF}+2*F_{CHANNEL})$ is received at tuner 10 in blocks S510-S512.

Optionally, the presence of image channels spaced at harmonics of $F_{MIX}$ from the intermediate frequency (e.g. $2*F_{MIX}\pm F_{IF}$, $3*F_{MIX}\pm F_{IF}$, $4*F_{MIX}\pm F_{IF}$, $5*F_{MIX}\pm F_{IF}$, etc.) may also be assessed in block S512. Conveniently, by using a local oscillator 18 that produces square waves, the presence of image channels at spaced odd harmonics (if any) of $F_{MIX}$ from the intermediate frequency (e.g. $3*F_{MIX}\pm F_{IF}$, $5*F_m\pm F_{IF}$, etc.) will be more prominent than image channels at even harmonics. Again, the presence or absence of an image channel at harmonics of $F_{MIX}$ may be tested with reference to memory 32, and the channels detected in the scan in blocks S506-S510.

Now, for channels for which an image channel has been detected, a new $F_{IF}=F_{IF}+\Delta$ may be selected by controller 30 and noted in memory 32 in block S516. The newly selected intermediate frequency may be chosen based on the location and width of the undesired image channel that is being avoided, the bandwidth of filter 20 that is being used to assist in rejecting the undesired image channel and the proximity of any other undesired channels. For example, a new $F'_{IF}=F_{IF}+BW/2$ may be chosen.

Once chosen, the presence of a new image channel at $F'_{IF}+2*F_{CHANNEL}$ may be tested by controller 30. If none is present, the chosen $F'_{IF}$ may be used. If a new image channel exists, $F'_{IF}=F_{IF}-BW/2$ may be tested. Different acceptable values of $\Delta$ may be tested. Optionally, again the presence of image channels at the spaced odd harmonics of $F'_{MIX}$ from the modified intermediate frequency may be assessed (e.g. $2*F'_{MIX}\pm F'_{IF}$, $3*F'_{MIX}\pm F'_{IF}$, $4*F'_{MIX}\pm F'_{IF}$, $5*F'_{m}\pm F'_{IF}$, etc.)

If no clear new intermediate frequency can be determined, SNR/CNR power of image channels/signals can be measured at demodulator 22 and/or decoder 24, and the best possible one of the alternatives may be used. For instance, a modified intermediate frequency for which the least power image channels/signals are mixed to the modified intermediate frequency may be used. Likewise, $F_{IF}$ could be adjusted by varying $\Delta$, for example, in 1 MHz or smaller increments, and measuring the interference of any image channel/signal. In this way, an image channel could be allowed to partially overlap with a tuned channel at an intermediate frequency, while causing only tolerable interference.

The presence of image channels and other image signals may alternatively be detected in a number of ways. For example, the presence of an image channel/signal could be detected by turning off one or any combination of filters 14, 17, 20 and/or image rejection techniques in mixer 18 to determine if the signal strength increased. An increase in the signal strength when image rejection is removed is an indication of the presence of power in the image channel. In another embodiment, a channel removal filter (e.g. filter 14) may be applied to the desired channel. If all the power of the desired channel is removed by filter 14 the power that remains at the intermediate frequency is an indication of power at the image channel(s). Alternatively, the frequency of the mixing signal may be increased or decreased slightly (e.g. in 1 MHz increments), and the power in a guard band below or above the intermediate frequency may be monitored, to determine the presence of an image channel at the intermediate frequency. In still another embodiment, a signal quality measurement may be made. If the signal quality is improved by moving the target frequency, an image channel/signal exists. For digital channels, a modified intermediate frequency producing the lowest bit error rate (BER) as assessed through decoder 24 may be chosen, and noted in memory 32.

Once, an appropriate $F'_{IF}$ for a particular channel has been identified it too may be noted in memory 32.

Blocks S510-S516 may be repeated for all channels identified in the channel scan performed in blocks S502-S506.

Additionally, each time a new channel is added, for example manually, the presence of an image channel/signal for the new channel may be determined by performing blocks S510-S516, or by testing for the presence an image channel/signal for the newly added channel using any of the above described techniques. In the presence of an image channel a modified $F'_{IF}$ for the newly added channel may be stored in memory 32.

In use, when an appropriate channel is tuned, controller 30 consults memory 32 to determine if $F_{IF}$ or another modified intermediate frequency, $F'_{MIX}$ should be used. In the event $F'_{IF}$ is used, the value of $\Delta$ or $F'_{IF}$ or an indicator thereof is retrieved from memory 32. Controller 30 may adjust local oscillator 18 to $F_{MIX}$ or $F'_{MIX}$. This, in turn, moves the intermediate frequency to $F'_{IF}$. The frequency of clock 26 may also be adjusted from $8 \times F_{IF}$ to $8 \times F'_{IF}$.

Optionally instead of performing a channel scan in blocks S502-S506, the presence of an image channel at $F_{IF}$ or $F'_{IF}$ may be determined by tuning to a channel and then tuning to an image channel and detecting the presence or absence of a signal. If a channel is present a new $F'_{IF}$ may be tested/chosen as described above. This could be done in place of S502-S516, or whenever a channel is added to an existing list of channels already stored in memory 32.

Figure 6A:
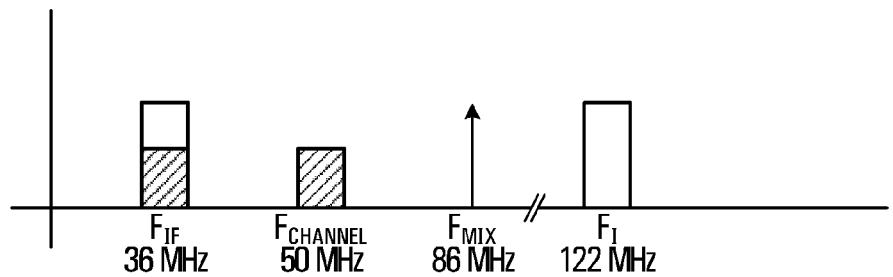
FIG. 6A is a spectral graph, illustrating the presence of a channel to be tuned, an image channel, and a first intermediate frequency to which the channel is to be mixed.
Figure 6B:
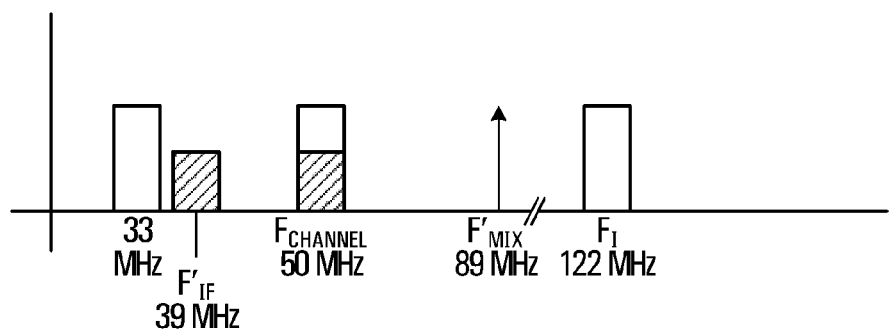
FIG. 6B is a spectral graph of signals of FIG. 6A mixed to a modified intermediate frequency.
Figure 6C:
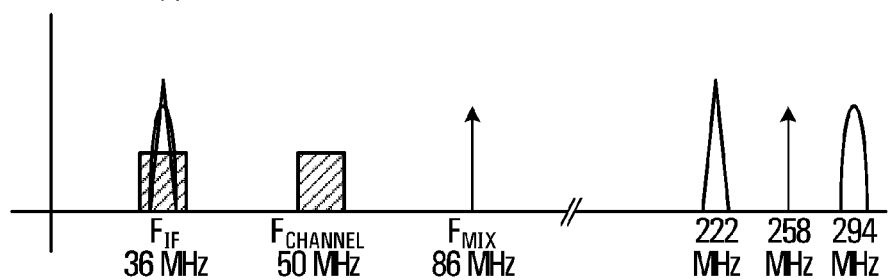
FIG. 6C is a spectral graph, illustrating an image channel around the third harmonic of a mixing frequency, and those signals mixed by the un-modified mixing frequency.

Example tuning of a channel using tuner/receiver 10 may better be appreciated with reference to FIGS. 6A-6C. Specifically, $F_{IF}$ is initially chosen as 36 MHz. A desired channel at 50 MHz is to be tuned. A signal is at 122 MHz, as illustrated in FIG. 6A. A suitable $F_{MIX}$ to tune the channel would have a frequency $F_{MIX}=50+36=86$ MHz. As such, the signal at $F_{MIX}+F_{IF}=122$ MHz acts as an interferer, and would also be tuned to $F_{IF}$.

Accordingly, exemplary of embodiments of the present invention, $F_{IF}$ may be adjusted to $F'_{IF}$, for example, 39 MHz, as illustrated in FIG. 6B. So adjusted, $F'_{MIX}$ would be chosen as 89 MHz and the signal at $F_{I}=122$ MHz would be mixed to 33 MHz. If the signal at 122 MHz is band limited to 6 MHz (eg an NTSC TV channel), the signal at 122 MHz mixed to 33 MHz no longer interferes.

Figure 6D:
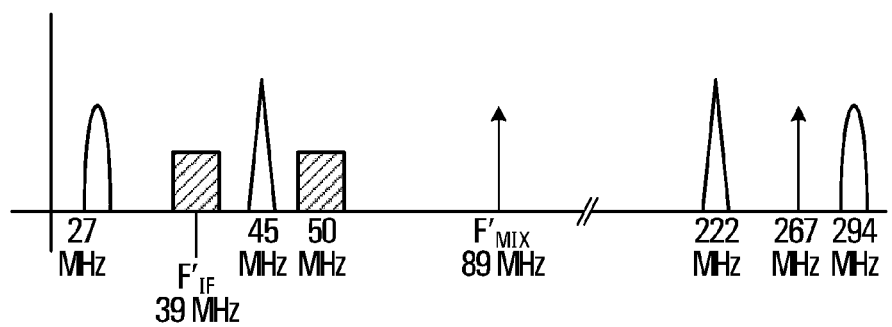
FIG. 6D is a spectral graph, illustrating an image channel around the third harmonics of a mixing frequency, and those signals mixed by the modified mixing frequency.

Likewise, as illustrated in FIG. 6C, third harmonic of the original mixing signal $F_{MIX}$ at $3*86=258$ MHz will/would cause signals at 222 MHz and 294 MHz to be mixed to $F_{IF}$ at 36 MHz. At a modified mixing frequency of $F'_{MIX}=89$ MHz, these signals would now be mixed to 27 and 45 MHz, as illustrated in FIG. 6D.

If, however, the bandwidth of the image channel at 294 MHz exceeds about 6 MHz, it may interfere with the channel to be tuned. As such, a modified intermediate frequency of 39 MHz may not be appropriate.

Additionally, a mixing signal at 89 MHz will mix signals at $3*89+/-39=306/228$ MHz to the new intermediate frequency of 39 MHz. If signals are present at these frequencies, the new intermediate frequency of 39 MHz may not be appropriate.

Figure 6E:
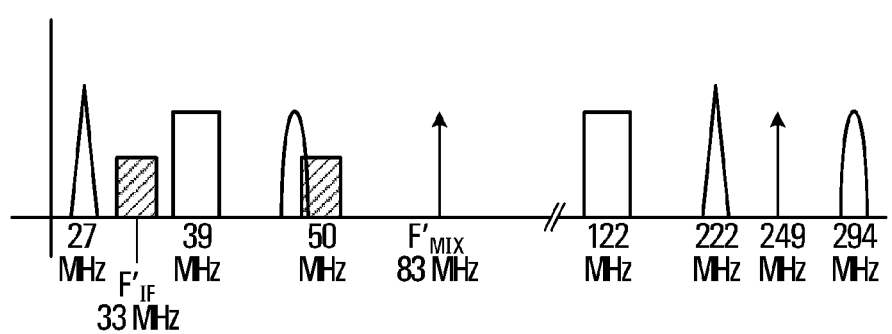
FIG. 6E is a spectral graph, illustrating an image channel around the third harmonic of a mixing frequency, and those signals mixed by the modified mixing frequency.

If a mixing frequency $F'_{MIX}$ of 89 MHz is not appropriate, (with a modified intermediate frequency of 39 MHz), an intermediate frequency of 33 MHz may be tested. To that end, previously identified image channels at 122, 222 and 294 MHz would be shifted to 39, 27 and 45 MHz, as illustrated in FIG. 6E. Again, this may not be satisfactory as the image channel at 294 MHz has now been mixed to 45 MHZ.

As should now be appreciated, although the above tuner/receivers have been described to use non-zero intermediate frequencies, the invention could likewise be used in a direct conversion tuner. In such a tuner, the first selected frequency would be baseband. In the presence of image signals this selected frequency could be adjusted.

Of course, the above described embodiments are intended to be illustrative only and in no way limiting. The described embodiments of carrying out the invention are susceptible to many modifications of form, arrangement of parts, details and order of operation. The invention, rather, is intended to encompass all such modification within its scope, as defined by the claims.

What is claimed is:

1. A method of frequency-shifting a desired channel to an intermediate frequency, comprising:
   selecting a first intermediate frequency within a search band, wherein the search band has a bandwidth of at least a bandwidth of the desired channel;
   selecting a mixing frequency suitable for frequency-shifting the desired channel to the selected intermediate frequency;
   frequency-shifting the desired channel to the selected intermediate frequency using the selected mixing frequency;
   determining if the desired channel frequency-shifted to the selected intermediate frequency includes interference frequency-shifted from an image channel;
   in response to finding interference, selecting an alternative intermediate frequency within the search band and repeating the steps of: selecting a mixing frequency suitable for frequency-shifting the desired channel to the alternative intermediate frequency; frequency-shifting the desired channel; and determining if the desired channel frequency-shifted to the selected alternative intermediate frequency includes interference from an image channel.

2. The method of claim 1, further comprising:
   selecting, from previously selected intermediate frequencies and corresponding mixing frequencies, an intermediate frequency and corresponding mixing frequency at which the least interference from an image channel was detected.

3. The method of claim 1, wherein a spacing between the first and the alternative intermediate frequencies equals at least half a bandwidth of the desired channel.

4. The method of claim 1, wherein a spacing between the first and the alternative intermediate frequencies equals at least half a bandwidth of the image channel.

5. The method of claim 1, wherein a spacing between the first and the alternative intermediate frequencies includes a guard band.

6. The method of claim 1, wherein the image channel is centered at an integer multiple of the selected mixing frequency plus the selected intermediate frequency, the integer being 1 or higher.

7. The method of claim 1, wherein the image channel is centered at an integer multiple of the selected mixing frequency minus the selected intermediate frequency, the integer being 1 or higher.

8. The method of claim 1, further comprising:
   providing a number of sample clocks at least equal to a number of intermediate frequencies, where each of the sample clocks has a frequency equal to an integer multiple of the respective intermediate frequency, the integer being 2 or higher; and
   sampling a signal at the selected intermediate frequency at the rate of a corresponding sample clock.

9. The method claim 1, further comprising storing a location of the desired channel and an indicator of a suitable mixing frequency for the desired channel.

10. The method of claim 1, further comprising bandpass-filtering a signal at an intermediate frequency using at least the search band bandwidth.

11. The method of claim 10, wherein the bandpass filtering is performed using an analog filter.

12. The method of claim 1, further comprising adjusting a center frequency of a bandpass filter and bandpass-filtering a signal at an intermediate frequency using the bandpass filter.

13. The method of claim 12, further comprising using a clock to control the bandpass filter center frequency.

14. A method of receiving radio channels with reduced image interference, comprising:
   scanning radio channels in a frequency range to detect a portion of the radio channels including signals;
   storing indicators of detected channels in a memory, wherein the detected channels represent the portion of the radio channels including signals;
   selecting a first mixing frequency within a mixing frequency search band, wherein the mixing frequency search band has a bandwidth of at least a bandwidth of a detected channel;
   selecting one of the detected channels;
   determining if the selected detected channel may suffer image interference from a second detected channel when the selected detected channel is mixed with the first mixing frequency; and
   in response to the determination that the selected detected channel may suffer image interference, selecting a second mixing frequency within the mixing frequency search band that causes reduced image interference when the selected detected channel is mixed with the second mixing frequency.

15. The method of claim 14, further comprising storing in the memory an indicator of the second mixing frequency for the selected detected channel.

16. The method of claim 14, further comprising:
   mixing the selected detected channel with the second mixing frequency to shift the selected detected channel to a channel with an intermediate frequency; and
   bandpass filtering a signal in the channel with the intermediate frequency to receive the selected detected channel with reduced image interference.

17. The method of claim 16, wherein the bandpass filtering is performed using at least the mixing frequency search band bandwidth.

18. The method of claim 16, wherein the bandpass filtering is performed using a filter of which a center frequency can be controlled.

19. The method of claim 18, further comprising using a clock to control the filter center frequency.

20. The method of claim 14, wherein a spacing between the first mixing frequency and the second mixing frequency equals at least half a bandwidth of the selected detected channel.

21. The method of claim 14, wherein a spacing between the first mixing frequency and the second mixing frequency equals at least half a bandwidth of the second detected channel.

22. The method of claim 14, wherein a spacing between the first mixing frequency and the second mixing frequency includes a guard band.

23. The method of claim 14, wherein a difference between an integer multiple of the first mixing frequency and a selected detected channel center frequency equals a difference between a second detected channel center frequency and the integer multiple of the first mixing frequency, the integer being 1 or higher.

24. A frequency-shifting circuit comprising:
   a mixer and a local oscillator configured for frequency-shifting a desired channel;
   a controller for controlling a local oscillator mixing frequency, the controller operable to:
   select a first intermediate frequency within a search band, wherein the search band has a bandwidth of at least a bandwidth of the desired channel;

select a mixing frequency suitable for frequency-shifting the desired channel to the selected intermediate frequency;

control the local oscillator to provide the selected mixing frequency;

frequency-shift the desired channel to the selected intermediate frequency using the selected mixing frequency;

determine if a signal detected at the selected intermediate frequency includes interference frequency-shifted from an image channel;

in response to finding interference, select an alternative intermediate frequency within the search band and repeat the steps of: selecting a mixing frequency suitable for frequency-shifting the desired channel to the alternative intermediate frequency; frequency-shifting the desired channel; and determining a presence of interference frequency-shifted from an image channel.

25. The frequency-shifting circuit of claim 24, wherein the controller is further operable to select, from previously selected intermediate frequencies and corresponding mixing frequencies, an intermediate frequency and corresponding mixing frequency at which less interference was detected.

26. The frequency-shifting circuit of claim 24, wherein a spacing between the first and the alternative intermediate frequency equals at least half a bandwidth of the desired channel.

27. The frequency-shifting circuit of claim 24, wherein a spacing between the first and the alternative intermediate frequency equals at least half a bandwidth of the image channel.

28. The frequency-shifting circuit of claim 24, wherein a spacing between the first and the alternative intermediate frequency includes a guard band.

29. The frequency-shifting circuit of claim 24, further comprising:

an adjustable clock configured to provide a number of sample clocks at least equal to a number of intermediate frequencies, where each of the sample clocks has a frequency equal to an integer multiple of the respective intermediate frequency, the integer being 2 or higher; and an analog to digital converter to sample an output signal of the mixer at the rate of one of the sample clocks.

30. The frequency-shifting circuit of claim 24, further comprising a memory for storing a frequency of the desired channel and an indicator of a suitable mixing frequency for the desired channel.

31. The frequency-shifting circuit of claim 24, further comprising a bandpass filter, the bandpass filter being electrically coupled with an output of the mixer, wherein a bandwidth of the bandpass filter equals at least the search band bandwidth.

32. The frequency-shifting circuit of claim 31, wherein the bandpass filter is an analog filter.

33. The frequency-shifting circuit of claim 24, further comprising a bandpass filter, the bandpass filter being electrically coupled with an output of the mixer, wherein a center frequency of the bandpass filter is adjustable.

34. The frequency-shifting circuit of claim 33, wherein the center frequency of the bandpass filter is controlled by a clock.

* * * * *